(12) United States Patent
Yamada (10) Patent No.: US 6,211,935 B1
(45) Date of Patent: Apr. 3, 2001

(54) ALIGNMENT DEVICE FOR AN IC-MOUNTED STRUCTURE

(75) Inventor: Shigetoshi Yamada, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/126,149

(22) Filed: Jul. 30, 1998

(30) Foreign Application Priority Data

Jul. 30, 1997 (JP) .................................................. 9-204694
May 20, 1998 (JP) ................................................. 10-138904

(51) Int. Cl.$^7$ ...................... G02F 1/1345; G02F 1/1333; G02F 1/1337
(52) U.S. Cl. ........................... 349/149; 349/158; 349/191
(58) Field of Search ..................................... 349/149, 191, 349/158, 152; 257/797; 361/792; 438/401

(56) References Cited

U.S. PATENT DOCUMENTS

| | | | |
|---|---|---|---|
| 4,777,117 | * | 10/1988 | Murata et al. ........................ 430/293 |
| 5,128,283 | * | 7/1992 | Tanaka ................................. 437/228 |
| 5,231,471 | * | 7/1993 | Torigoe ................................ 356/401 |
| 5,674,650 | * | 10/1997 | Dirksen et al. ........................ 430/22 |
| 5,729,315 | * | 3/1998 | Takahashi et al. ..................... 349/149 |
| 5,771,085 | * | 6/1998 | Ochi et al. ............................ 349/158 |
| 5,783,490 | * | 7/1998 | Tseng .................................... 438/692 |
| 5,859,478 | * | 1/1999 | Hagi ...................................... 257/797 |
| 5,876,884 | * | 3/1999 | Maeda et al. .......................... 430/22 |
| 5,923,996 | * | 7/1999 | Shih et al. ............................. 438/462 |
| 5,936,311 | * | 8/1999 | Watrobski et al. ..................... 257/797 |
| 5,936,695 | * | 8/1999 | Hida et al. ............................ 349/153 |
| 5,972,793 | * | 10/1999 | Tseng .................................... 438/692 |

* cited by examiner

Primary Examiner—William L. Sikes
Assistant Examiner—Tarifur R. Chowdhury
(74) Attorney, Agent, or Firm—Harness, Dickey & Pierce, P.L.C.

(57) ABSTRACT

An alignment mark 4K is formed by a through hole in an opaque circuit substrate 1. An alignment mark 4I of an IC chip 3 is photographed by a CCD camera 9 through the alignment mark hole 4K, and the position of the IC chip 3 is adjusted so that the IC side alignment mark 4I is in the prescribed positional relationship to the substrate side alignment mark hole 4K. Then, the IC chip 3 is adhered to the circuit substrate 1 using the adhesive such as ACF 2, etc. Both alignment marks 4I and 4K can be simultaneously photographed by one photograph of the camera 9, and the alignment can be continuously performed.

18 Claims, 6 Drawing Sheets

ALIGNMENT DEVICE FOR AN IC-MOUNTED STRUCTURE

BACKGROUND OF THE INVENTION

1. Industrial Field of the Invention

The present invention relates to an IC mounting structure to mount an IC chip on an opaque circuit substrate such as a circuit substrate made of epoxy resin and, more specifically, relates to the IC mounting structure which is suitable for positioning, i.e., for alignment of an electrode of the IC chip and a terminal to be arranged on the circuit substrate corresponding thereto with each other. The present invention also relates to a liquid crystal device comprising the IC mounting structure. The present invention further relates to an electronic device comprising the liquid crystal device.

2. Description of the Related Art

Liquid crystal devices have been extensively used in recent years for a visual image display part of portable electronic terminals, electronic notebooks, and other electronic devices. The liquid crystal device is generally formed by attaching a pair of transparent substrates, which are respectively provided with a transparent electrode, to each other with a clearance gap provided therebetween, and filling the liquid crystal in the clearance. A polarizer is further mounted on an outer surface of the transparent substrate as necessary, and a color filter is provided on an inner surface of one transparent substrate as necessary. The light to be supplied to the liquid crystal can be modulated by controlling the orientation of the liquid crystal molecules depending on whether the prescribed voltage is applied or no voltage is applied to the transparent electrodes which are opposite to each other with the liquid crystal provided therebetween. Thereby, the visible information such as characters and numerals is displayed.

Concerning a regular liquid crystal device, in order to control the voltage to be applied to the transparent electrodes opposite to each other at a prescribed amount, the electrode terminal formed on the transparent substrate and the electrode of the IC chip for driving the liquid crystal, e.g., a bump electrode, are positionally adjusted, in other words, aligned, and then, conductive-connected to each other, and thereafter, the prescribed voltage is applied to the transparent electrodes in accordance with the instruction from the IC chip. Various kinds of methods to connect the IC chip for driving the liquid crystal to the transparent substrate have been conventionally known. For example, as seen in the liquid crystal device of the so-called COG (Chip On Glass) system, there is an IC mounting structure, where the IC chip is directly mounted on the transparent substrate comprising the liquid crystal panel is known.

According to the IC mounting structure, the IC chip can be observed through the substrate using a camera because the substrate on which the IC chip is mounted is transparent. Accordingly, the alignment of the substrate and IC chip is performed by a simple work. When the IC chip is directly mounted on the transparent substrate, the circuit constitution accompanied by the IC chip is required to be formed on the transparent substrate by ITO (Indium Tin Oxide), etc. In such case, however, no complicated circuit constitution can be formed on the transparent substrate.

Figure 8:
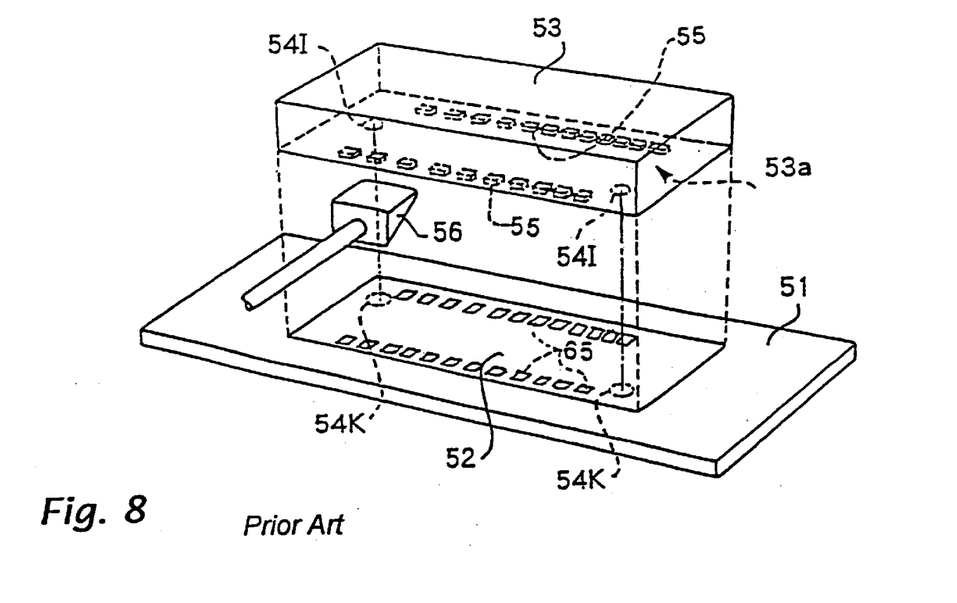
FIG. 8 is a perspective view illustrating one example of the conventional IC mounting structure.

On the other hand, when the circuit substrate is formed using an opaque material such as glass epoxy resin, a complicated circuit can be formed. For example, a circuit can be formed on both faces of the circuit substrate and connected to each other using a through hole. When the IC chip is mounted on such an opaque circuit substrate, for example as indicated in FIG. 8, an IC chip 53 for driving the liquid crystal is adhered to an opaque circuit substrate 51 using an adhesive such as ACF (Anisotropic Conductive Film) 52. Further, when the formed circuit substrate unit is mounted on the liquid crystal panel of the liquid crystal device, a bottom side of the opaque circuit substrate 51 is adhered to the transparent substrate of the liquid crystal panel.

As indicated in FIG. 8, when the IC chip 53 is mounted on the opaque circuit substrate 51, an alignment mark 54K is formed at the prescribed position of the circuit substrate 51 in the conventional practice, while an alignment mark 54I is formed at the prescribed position of an active side 53a of the IC chip 53, and the IC chip 53 is adhered to the circuit substrate 51 in a condition where both alignment marks 54K and 54I are adjusted to each other to be at the same position.

An electrode, for example, a bump electrode 55 is formed on the active side 53a of the IC chip 53. An electrode terminal 65 is formed on a surface of the circuit substrate 51. Wiring is formed depending on the situation between bump electrodes 55 and between electrode terminals 65, which is not shown in the figure. The alignment marks 54K and 54I are used for positioning the electrodes 55 and the electrode terminals 65, i.e., for alignment with each other.

To positionally align both alignment marks 54K and 54I with each other, the following process is performed in the conventional practice. That is, a prism 56 to guide the light to the camera or the camera itself (not shown in the figure) is inserted between the circuit substrate c1 and the IC chip 53, the alignment mark 54I on the IC chip and the alignment mark 54K on the circuit substrate are successively photographed using the prism 56 or the like, the prism 56 is pulled out from between the circuit substrate 51 and the IC chip 53, the position of the circuit substrate 51 and the IC chip 53 is adjusted based on the photographed image by the camera, and then, the circuit substrate 51 and the IC chip 53 are adhered to each other.

However, in the conventional IC mounting structure, the prism 56 or the camera itself (not shown in the figure) must be inserted or pulled out between the circuit substrate 51 and the IC chip 53 to align the circuit substrate 51 with the IC chip 53, and the photographing view of the inserted prism 56 or the camera must be changed by turning between the circuit substrate 51 and the IC chip 53, and as a result, it takes a very long time to align the circuit substrate 51 with the IC chip 53, presenting a problem in that the productivity is worsened.

The present invention is performed in light of the above-mentioned problem in the conventional IC mounting structure, and the object of the present invention is to perform the work to mount the IC chip on the opaque circuit substrate with an extremely simple and quick process.

SUMMARY OF THE INVENTION

In order to achieve the above-mentioned object, the IC mounting structure of the present invention is characterized in that, in the IC mounting structure to mount the IC chip on the opaque circuit substrate, the substrate side alignment mark to be formed on the above-mentioned circuit substrate and the IC side alignment mark which is formed on the IC chip and adjusted to be at the same position as the above-mentioned substrate side alignment mark are provided, and the above-mentioned substrate side alignment mark is a light-transmitting one.

In the IC mounting structure, since the alignment mark on the opaque circuit substrate side is formed of the light-transmitting mark, the IC chip can be photographed by the camera through the alignment mark on the circuit substrate in a condition that the camera is set at the opposite side to the IC chip with the circuit substrate provided therebetween. Namely, both the circuit substrate side alignment mark and the IC side alignment mark can be photographed at the same time by one photographing operation by the camera, and both alignment marks can be aligned based on the photographed information. As a result, the work to mount the IC chip on the opaque circuit substrate can be performed with an extremely simple and quick process.

In the above-mentioned constitution, the "opaque circuit substrate" can be formed of, for example, glass epoxy resin which is a composite material of glass fiber and epoxy resin, ceramics, polyimide film, metal, etc. In addition, in place thereof, a composite material consisting of a first material comprising aramid fiber or a mixed material of glass fiber with aramid fiber, and a second material comprising polyimide resin or BT (Bismaleimide Triazine) resin, etc. can be used. The circuit substrate can also be formed using the substrate material consisting of the single material such as epoxy resin, polyimide resin, and BT resin, or the mixed or compound material thereof. These circuit substrates enable to form more complicated circuits comparing with the case where the circuit is formed on the transparent substrate such as glass by ITO (Indium Tin Oxide).

In the above-mentioned constitution, the "light-transmitting mark" means the marks of any kind, which have a constitution the light can pass through, and also includes a mark, for example, formed by a through hole in the circuit substrate and a part corresponding to the mark formed of the light-transmitting material.

The shape of both the substrate side alignment mark and the IC side alignment mark is not limited to any specific one. However, in order to position both marks quickly and accurately, it is preferable to form the light-transmitting mark, which works as the substrate side alignment mark, as the mark having the counter shape which is a similar figure but slightly larger than the counter shape of the IC side alignment mark.

In the above-mentioned constitution, the light-transmitting mark provided on the circuit substrate can be a through hole in the circuit substrate. Thus, the light-transmitting mark can be formed simply and precisely at the desired position. For example, when the IC side alignment mark has a circular shape, the light-transmitting mark on the substrate side can be provided by a circular hole having a diameter slightly larger than the circular shape of the IC side alignment mark.

Next, the liquid crystal device of the present invention is characterized in that the circuit substrate including the above-mentioned IC mounting structure is mounted on at least either of a pair of the transparent substrates, which is provided in the liquid crystal device having a pair of transparent substrates opposite to each other with a clearance gap provided therebetween and the liquid crystal filled the clearance gap.

In the liquid crystal device, the following works are performed when the opaque circuit substrate on which the IC chip is mounted on the transparent substrate of the liquid crystal panel. That is, an alignment mark is formed on an appropriate part of the circuit substrate, an alignment mark is also formed on an appropriate part of the transparent substrate, the alignment mark on the circuit substrate is photographed by the camera for checking the position through the transparent substrate, and the relative position between the circuit substrate and the transparent substrate is adjusted based on the photographed images of both alignment marks, and then, the circuit substrate and transparent substrate are adhered together.

The electronic device of the present invention comprises the liquid crystal device of the above-mentioned structure and a control part to control the operation of the liquid crystal device. The electronic devices of this constitution include a portable electronic terminal, an electronic notebook, a portable telephone, and other various devices as specific embodiments.

DETAILED DESCRIPTION OF THE PREFERRED EMBODIMENTS

Figure 5:
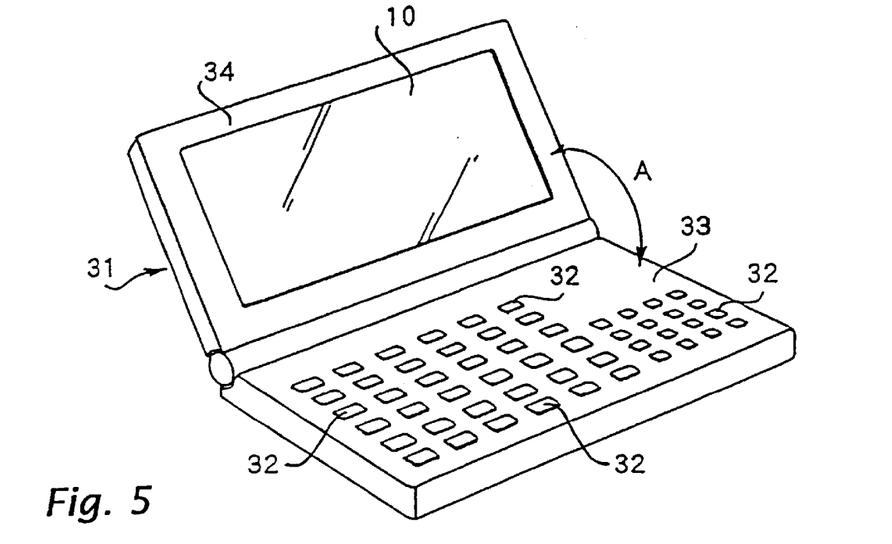
FIG. 5 is a perspective view illustrating one embodiment of the electronic device of the present invention.

FIG. 5 illustrates a portable electronic terminal which is one of the embodiments of the electronic device of the present invention. A portable electronic terminal 31 comprises a keyboard part 33 provided with a plurality of keys 32, a lid part 34 to be turnably opened/closed relative to the keyboard part 33?as indicated by the arrow A, and a liquid crystal device 10 embedded in the lid part 34. A CPU (Central Processing Unit) to perform various operations to achieve the function as the portable electronic terminal is stored in the keyboard part 33. The image processing to display the prescribed image on the liquid crystal device 10 is included in the operation of the CPU.

Figure 4:
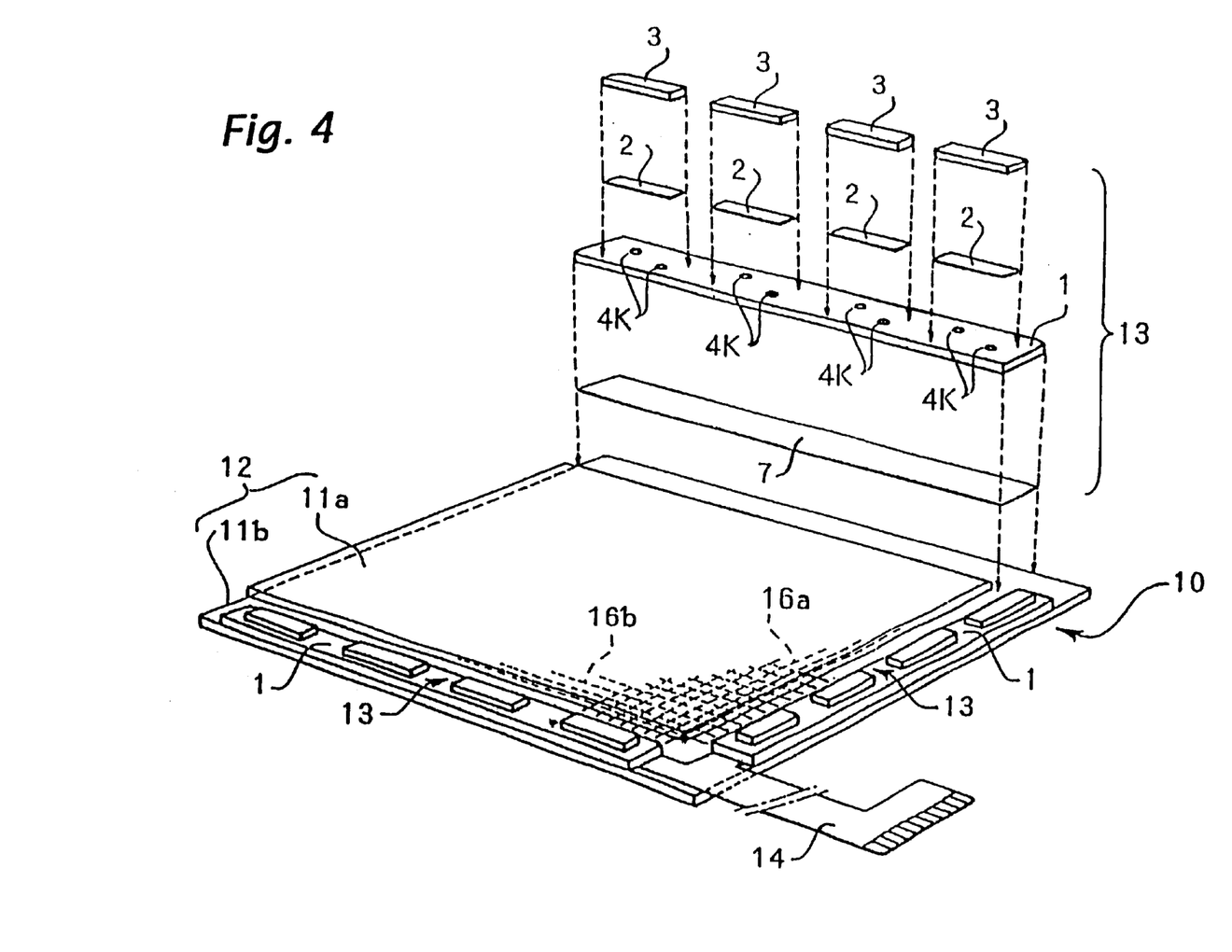
FIG. 4 is a partly sectioned perspective view illustrating one embodiment of the liquid crystal device of the present invention.

The liquid crystal device 10 comprises, for example, as indicated in FIG. 4, a liquid crystal panel 12 containing a pair of transparent substrates 11a and 11b, a plurality of (three in the present embodiment) IC units 13 to be mounted on the liquid crystal panel 12, and an FPC (Flexible Printed Circuit) 14 to connect each IC unit 13 with an external device. An appropriate wiring pattern is formed in the FPC 14, but it is omitted in the figure. The prescribed gap is formed between a pair of transparent substrates 11a and 11b, and the liquid crystal is contained in the gap. Striped transparent electrodes 16a and 16b are formed of ITO on an inner surface of the respective transparent substrates 11a and 11b, and a pixel dot is formed at the position where the transparent electrodes intersect at right angles to each other. A polarizer (not shown in the figure) is adhered to an outer surface of the respective transparent substrates 11a and 11b, and further a color filter is provided on the inner surface of either transparent substrate depending on the situation.

The IC unit 13 comprises an opaque circuit substrate 1 formed of glass epoxy resin, and an IC chip 3 for driving the liquid crystal adhered to the circuit substrate 1 using an ACF (Anisotropic Conductive Film). The whole IC unit 13 is mounted on the liquid crystal panel 12 by adhering a bottom side of the circuit substrate 1 to the transparent substrate 11b using the ACF 7.

Figure 3:
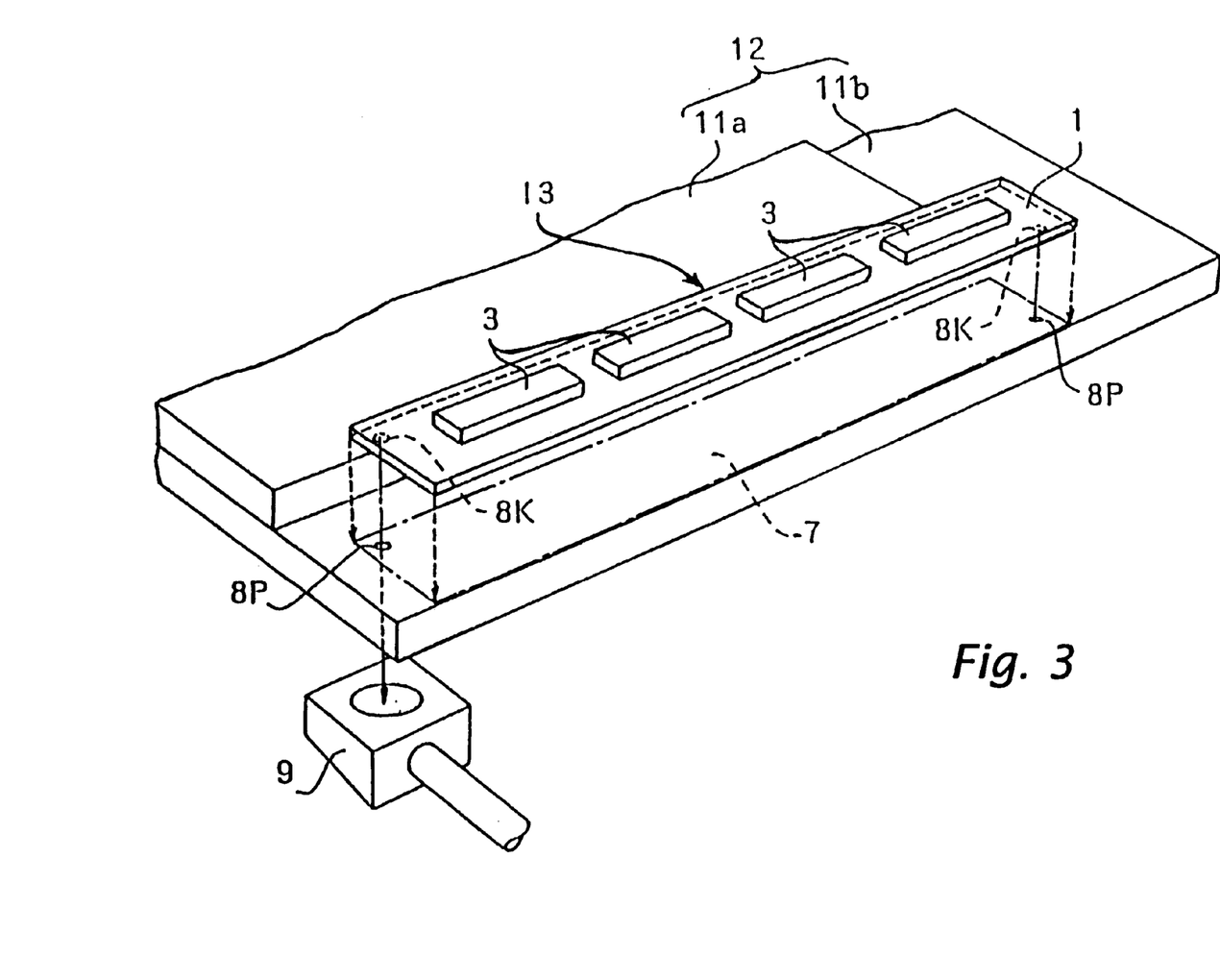
FIG. 3 is a perspective view illustrating one process in manufacturing the liquid crystal device of the present invention.

As indicated in FIG. 3, an alignment mark 8K on the circuit substrate side is formed at the prescribed position of the bottom side of the circuit substrate 1. On the other hand, an alignment mark 8P on the liquid crystal panel side is formed at an appropriate part of the transparent substrate 11b of the liquid crystal panel 12. These alignment marks are formed in various shapes as required, though in the present embodiment, they are formed in a circular shape.

When the IC unit 13 is mounted on the liquid crystal panel 12, a CCD camera 9 for checking the position is set on a back side of the transparent substrate 11b, and the circuit substrate 1 of the IC unit 13 is photographed through the transparent substrate 11b. Through the photographing, both the alignment mark 8P of the transparent substrate 11b and the alignment mark 8K of the IC unit 13 are simultaneously observed, the position of the liquid crystal panel 12 and the IC unit 13 is adjusted so that the alignment marks 8P and 8K are adjusted to each other to be in the same position, and then, the bottom side of the circuit substrate 1 of the IC unit 13 is adhered to the transparent substrate 11b by the ACF 7. Thus, the electrode terminal (not shown in the figure) of the circuit substrate 1 of the IC unit 13 is correctly conductive-connected to the electrode terminal (not shown in the figure) of the transparent substrate 11b.

In the present embodiment, the following mounting structure is adopted in the IC unit 13. Namely, in FIG. 1, an IC side alignment mark 4I is formed at an appropriate part of an active side 3a of the IC chip 3, while a substrate side alignment mark 4K is formed at the prescribed position of the opaque circuit substrate 1. In the present embodiment, the IC side alignment mark 4I is formed in a circular shape and the substrate side alignment mark 4K is formed by a through hole through the circuit substrate 1. The diameter of the substrate side alignment mark 4K is formed slightly larger than the diameter of the IC side alignment mark 4I.

Figure 1:
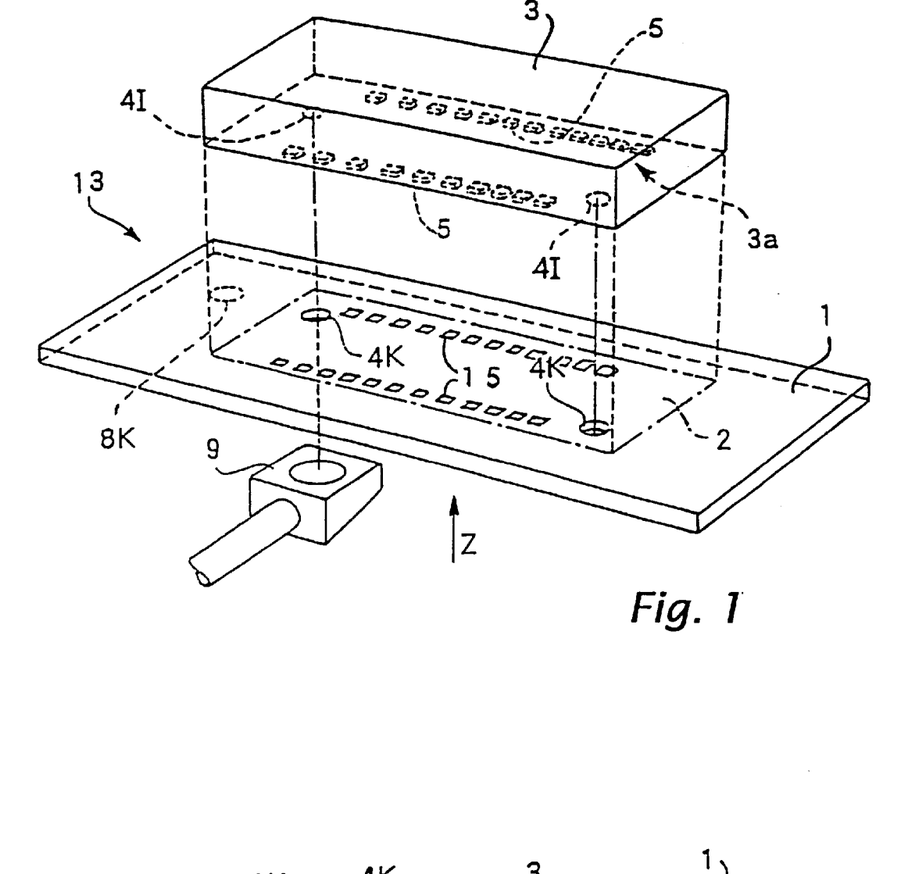
FIG. 1 is a perspective view illustrating one embodiment of the IC mounting structure of the present invention.

An electrode, for example, a bump electrode 5 is formed on the active side 3a of the IC chip 3. For example, the individual bump electrode 5 is formed with the dimensions of 40 μm in longitudinal width, 40 μm in transverse width, and 18 μm in height. On the surface of the circuit substrate 1, an electrode terminal 15 is formed at the position corresponding to the bump electrode 5 on the IC chip 3 side. Wiring is formed as necessary between the bump electrodes 5 and between each of the electrode terminals 15, which is omitted in the figure.

Figure 2:
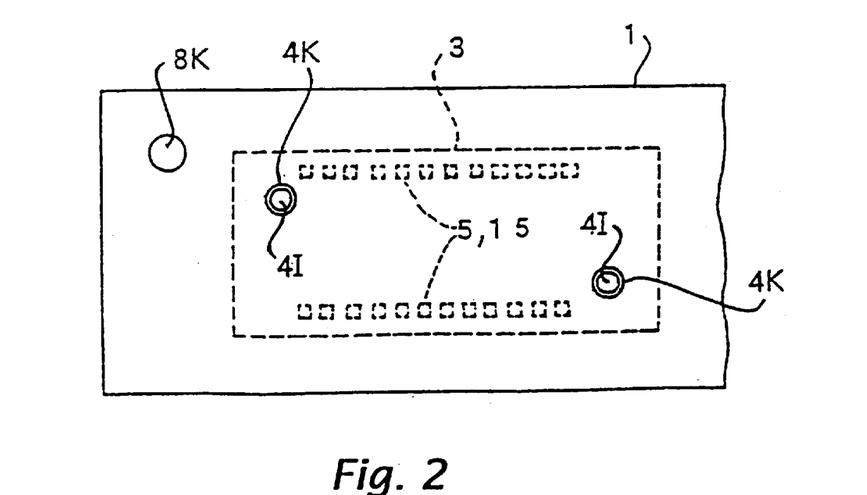
FIG. 2 is a plan view of the circuit substrate viewed from the direction of the bottom side following the arrow Z in FIG. 1.

When the IC unit 13 is formed, the CCD camera 9 is set on the back side of the circuit substrate 1, and the part in the vicinity of the alignment mark 4K of the circuit substrate 1 is photographed by the camera. As indicated in FIG. 2, the position of the IC chip 3 is adjusted so that the center of the substrate side alignment mark 4K is positioned at the identical point of the center of the IC side alignment mark 4I when the circuit substrate 1 is viewed from its bottom side, then the IC chip 3 is adhered to the circuit substrate 1 in the above mentioned condition. Thus, the bump electrode 5 is correctly aligned with the electrode terminal 15.

In the conventional IC mounting structure illustrated in FIG. 8, the prism 56 or a camera itself must be inserted or pulled out between the IC chip 53 and the circuit substrate 51, or the view of the prism 56, etc. must be switched between the IC chip 53 side and the circuit substrate 51 side, but in the present embodiment illustrated in FIG. 1, both the substrate side alignment mark 4K and the IC side alignment mark 4I can be simultaneously photographed by one photograph of the camera 9, and the alignment can be continuously performed. As a result, the mounting work of the IC chip can be performed in an extremely simple and quick manner.

Figure 6:
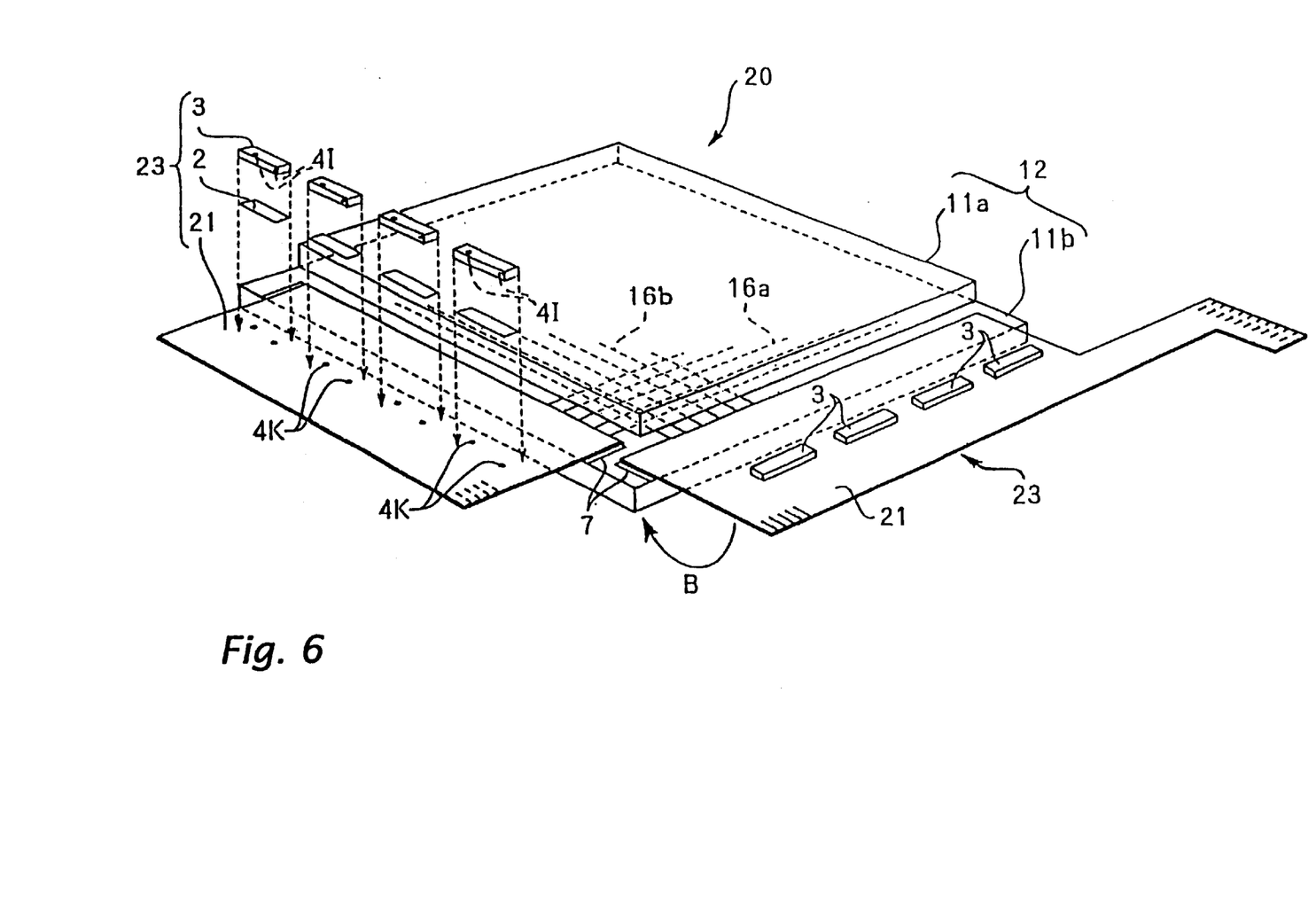
FIG. 6 is a partly sectioned perspective view illustrating another embodiment of the liquid crystal device of the present invention.

FIG. 6 illustrates another embodiment of the liquid crystal device of the present invention. A liquid crystal device 20 illustrated here comprises a liquid crystal panel 12 including a pair of transparent substrates 11a and 11b, and a plurality of (two in the present embodiment) IC units 23 to be mounted on the liquid crystal panel 12. Because the structure of the liquid crystal panel 12 is same as that of the liquid crystal panel 12 used in the previous embodiment illustrated in FIG. 4, an explanation thereof is omitted.

The IC unit 23 of the present embodiment comprises an opaque circuit substrate 21 formed of flexible material such as polyimide and an IC chip 3 for driving the liquid crystal adhered to the circuit substrate 21 using the ACF 2. An appropriate wiring pattern is formed on the circuit substrate 21, which is omitted in the figure. The whole IC unit 23 is mounted on the liquid crystal panel 12 by adhering the bottom side of the circuit substrate 21 to the transparent substrate 11b using the ACF 7. The mounting method of the IC unit 23 to the liquid crystal panel 12 is same as the case that the circuit substrate 1 is mounted on the liquid crystal panel 12 as illustrated in FIG. 3.

Similar to the case of the present embodiment as illustrated in FIG. 1, the IC side alignment mark 4I is formed at an appropriate part of the active side (the lower side in the figure) of the IC chip 3, while the substrate side alignment mark 4K is formed at the prescribed position of the opaque flexible circuit substrate 21 in FIG. 6. When the IC unit 23 is manufactured, the CCD camera (not shown in the figure) is set on the back side (i.e., lower side in the figure) of the circuit substrate 21 similar to the case of FIG. 1, and the part in the vicinity of the alignment mark 4K of the circuit substrate 21 is photographed by the camera. The position of the IC chip 3 is adjusted so that the center of the substrate side alignment mark 4K is positioned at the identical point of the center of the IC side alignment mark 4I, and the above mentioned condition, the IC chip 3 is adhered to the circuit substrate 21. The bump electrode (not shown in the figure) on the IC chip 3 side and the electrode terminal (not shown in the figure) on the circuit substrate 21 side are correctly aligned.

Figure 7:
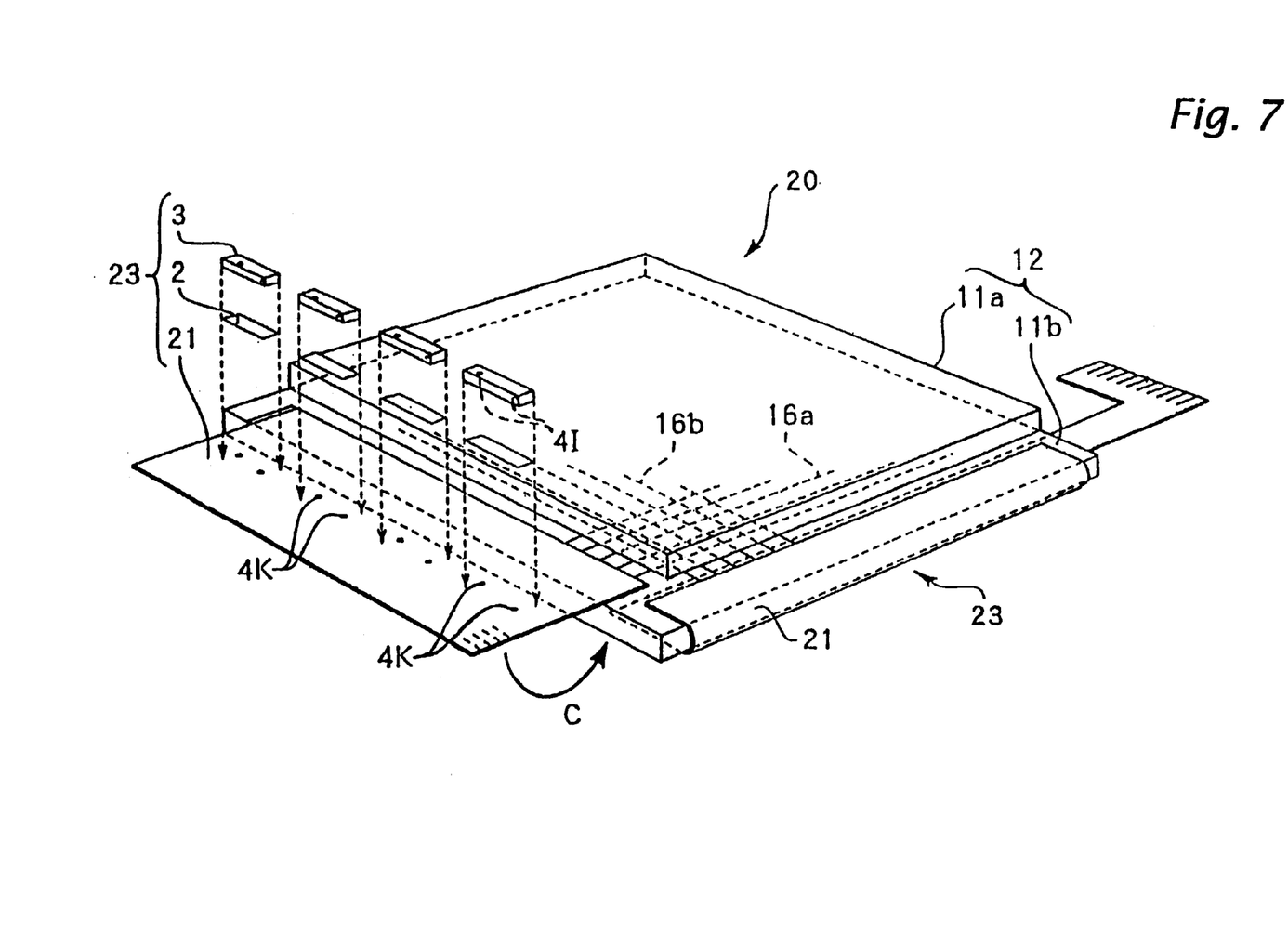
FIG. 7 is a perspective view illustrating the condition where the circuit substrate is deformed in the liquid crystal device shown in FIG. 6.

When the IC unit 23 is manufactured, and the IC unit 23 is connected to the transparent substrate 11b, the IC unit 23 is folded into the back side of the liquid crystal panel 20 as indicated by the arrow B, and as a result, most of the flexible circuit substrate 21 is folded into the back side of the liquid crystal panel 20. Then, another IC unit 23 is also folded into the back side of the liquid crystal panel 20 as indicated by the arrow C.

Consequently, in the present embodiment, IC 3 for driving the liquid crystal is arranged on the back side of the liquid crystal panel 20, and so, it is not necessary to secure the space for mounting the IC from a peripheral part of the liquid crystal panel 20. Thus, the area of the peripheral part of the liquid crystal panel 20 can be reduced, and as a result, the effective display range of the liquid crystal panel 20 can be expanded.

Also in the present embodiment, both the substrate side alignment mark 4K and the IC side alignment mark 4I can be simultaneously photographed by one photograph of the CCD camera, etc., and further, the marks can be continuously aligned. Consequently, the mounting work of the IC chip can be performed in an extremely simple and quick manner.

While the present invention has been explained with reference to preferable embodiments such as the above, the present invention is not limited to these embodiments but can be variously modified in the range of the inventions described in the claims.

For example, the IC mounting structure of the present invention can be used for arbitrary electronic elements other than the liquid crystal device, and can further be used for other arbitrary electronic devices than the portable electronic terminal. Besides, in the embodiment illustrated in FIG. 1, the light-transmitting mark is formed by through hole, but the mark can be formed by a light-transmitting material without providing a hole. The shape of both the substrate side alignment mark and the IC side alignment mark can be an arbitrary one other than circular.

According to the IC mounting structure of the present invention, because the IC chip can be observed through the substrate side alignment mark using the camera set on the back side of the opaque circuit substrate, both the substrate side alignment mark and the IC side alignment mark can be simultaneously photographed by one photograph of the camera, and their positions can be observed being compared with each other. As a result, the work to mount the IC chip on the opaque circuit substrate can be performed in an extremely simple and quick manner.

In the manufacturing line of the liquid crystal device, which is called a COG system and where the IC for driving the liquid crystal is directly mounted on a transparent glass substrate of the liquid crystal panel with a joining material such as ACF, it is common to determine the position of the IC chip for the transparent glass substrate by observing the IC side alignment mark, which is provided at an appropriate part of the IC for driving the liquid crystal, by the CCD camera, etc. through the transparent glass substrate.

Apart from this case, when the IC for driving the liquid crystal is mounted on the circuit substrate formed of the opaque material such as glass epoxy resin, the above-mentioned alignment device of COG system can not be applied to the IC mounting process performed on the opaque circuit substrate because the circuit substrate is opaque in the conventional practice.

On the other hand, if the opaque alignment mark on the circuit substrate side is formed of the light-transmitting mark, the IC chip can be photographed by the camera through the alignment mark of the circuit substrate in a condition where the camera is set on the opposite side to the IC chip with the circuit substrate provided therebetween, and the alignment device of COG system can be commonly used in the IC mounting process performed on the opaque circuit substrate. This is very convenient in manufacturing various kinds of liquid crystal devices in one manufacturing line.

Further, in the conventional IC mounting structure in which the IC chip is mounted on the opaque circuit substrate, the positional deviation of the IC chip from the circuit substrate can not be inspected after the mounting is completed because the circuit substrate is opaque, and in addition, the condition of the adhesive adhering the circuit substrate to the IC chip, for example, the hardened degree of the adhesive or the condition of generation of bubbles in the adhesive can not be inspected.

On the other hand, according to the IC mounting structure of the present invention, the positional deviation of the IC chip and the condition of the adhesive can be inspected after the mounting is completed because the space between the circuit substrate and the IC chip can be observed through the light-transmitting alignment mark provided on the opaque circuit substrate.

In the liquid crystal device of the present invention and the electronic device of the present invention, the circuit accompanied by the IC chip is formed on the opaque material such as glass epoxy resin, etc., and accordingly a complicated circuit can be simply and correctly formed compared with the case where the circuit is formed on the transparent substrate such as glass by ITO, etc.

What is claimed is:

1. An IC mounting structure to mount an IC chip on an opaque circuit substrate, comprising:
    a substrate side alignment mark to be formed on said circuit substrate; and
    an IC side alignment mark to be formed on the IC chip and aligned to said substrate side alignment mark, wherein said substrate side alignment mark is a light-transmitting through hole in said circuit substrate.

2. The IC mounting structure according to claim 1, wherein said substrate side alignment mark is slightly larger than the IC side alignment mark but a shape of both marks is similar to each other.

3. A liquid crystal device comprising:
    a pair of transparent substrates opposite to each other with a clearance gap provided therebetween; and
    a liquid crystal filled in the clearance gap, wherein the circuit substrate including the IC mounting structure according to claim 1 is mounted on at least one of a pair of said transparent substrates.

4. An electronic device comprising:
    the liquid crystal device according to claim 3; and
    a control part to control the operation of the liquid crystal device.

5. An IC mounting structure for mounting an IC chip on an opaque circuit substrate comprising:
    a first alignment mark formed on said IC chip; and
    a second alignment mark formed on said opaque circuit substrate, said second alignment mark being a light-transmitting through hole formed in said opaque circuit substrate.

6. The IC mounting structure of claim 5 wherein said second alignment mark is larger in size than said first alignment mark.

7. The IC mounting structure of claim 5 wherein said first and second alignment marks are complementarily shaped.

8. The IC mounting structure of claim 5 wherein said first and second alignment marks are circular.

9. A method of mounting an IC chip on an opaque circuit substrate comprising:
    providing a first alignment mark on said IC chip;
    providing a second alignment mark on said opaque circuit substrate, said second alignment mark being light-transmitting;
    positioning said IC chip adjacent said opaque circuit substrate;
    observing said first alignment mark through said second alignment mark;
    adjusting a location of said IC chip relative to said opaque circuit substrate until said first alignment mark is in a prescribed position relative to said second alignment mark; and
    adhering said IC chip to said opaque circuit substrate.

10. The method of claim 9 wherein said observing step further comprises photographing said first alignment mark through said second alignment mark.

11. The method of claim 9 wherein said second alignment mark is an opening formed in said opaque circuit substrate.

12. The method of claim 9 wherein said second alignment mark is larger in size than said first alignment mark.

13. The method of claim 9 wherein said first and second alignment marks are complimentarily shaped.

14. The method of claim 9 wherein said first and second alignment marks are circular.

15. A liquid crystal device comprising:

a first transparent substrate;

a second transparent substrate mounted opposite said first transparent substrate with a gap therebetween;

a liquid crystal disposed within said gap;

an opaque circuit substrate mounted to said first transparent substrate, said circuit substrate including a first alignment mark in the form of a light-transmitting through hole; and an IC chip mounted to said opaque circuit substrate, said IC chip including a second alignment mark aligned with said first alignment mark.

16. The liquid crystal device of claim 15 wherein said first alignment mark is larger in size than said second alignment mark.

17. The liquid crystal device of claim 15 wherein said first and second alignment marks are complementarily shaped.

18. The liquid crystal device of claim 15 wherein said first and second alignment marks are circular.

* * * * *

UNITED STATES PATENT AND TRADEMARK OFFICE
CERTIFICATE OF CORRECTION

PATENT NO. : 6,211,935 B1  
DATED : April 3, 2001  
INVENTOR(S) : Shigetoshi Yamada Page 1 of 1

It is certified that error appears in the above-identified patent and that said Letters Patent is hereby corrected as shown below:

Column 2,
Line 30, "c1" should be -- 51 --.

Column 3,
Line 23, delete "enable" and insert -- are able -- therefor.

Column 4,
Line 45, "33?as" should be -- 33, as --.

Column 6,
Line 29, after "is" insert -- the --.
Line 60, "IC 3" should be -- IC unit 23 --.

Column 7,
Line 46, "can not" should be -- cannot --.
Line 64, "can not" should be -- cannot --.

Column 8,
Line 2, "can not" should be -- cannot --.

Signed and Sealed this

Eleventh Day of September, 2001

*Attest:*

Nicholas P. Godici

NICHOLAS P. GODICI
*Attesting Officer*   *Acting Director of the United States Patent and Trademark Office*